(12) United States Patent
Jeng et al.

(10) Patent No.: US 7,646,078 B2
(45) Date of Patent: Jan. 12, 2010

(54) DIE SAW CRACK STOPPER

(75) Inventors: Shin-Puu Jeng, Hsinchu (TW);
Shih-Hsun Hsu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/654,428

(22) Filed: Jan. 17, 2007

(65) Prior Publication Data
US 2008/0169533 A1    Jul. 17, 2008

(51) Int. Cl.
*H01L 23/544* (2006.01)
(52) U.S. Cl. ............................... 257/620; 257/E23.194
(58) Field of Classification Search ................... 257/620
See application file for complete search history.

(56) References Cited

U.S. PATENT DOCUMENTS

| | | | |
|---|---|---|---|
| 5,096,855 A | 3/1992 | Vokoun, III | |
| 5,136,364 A | 8/1992 | Byrne | |
| 5,371,411 A | 12/1994 | Hara et al. | |
| 5,751,065 A | 5/1998 | Chittipeddi et al. | |
| 5,831,330 A | 11/1998 | Chang | |
| 6,114,766 A | 9/2000 | Shields | |
| 6,358,839 B1 | 3/2002 | Li et al. | |
| 6,365,958 B1 * | 4/2002 | Ibnabdeljalil et al. | 257/620 |
| 6,384,463 B1 | 5/2002 | Miles et al. | |
| 6,483,173 B2 | 11/2002 | Li et al. | |
| 6,492,716 B1 | 12/2002 | Bothra et al. | |
| 6,566,736 B1 | 5/2003 | Ogawa et al. | |
| 6,841,455 B2 * | 1/2005 | West et al. | 438/462 |
| 6,876,946 B2 | 4/2005 | Yasuda et al. | |
| 6,939,736 B2 | 9/2005 | Grabham et al. | |
| 6,963,389 B2 | 11/2005 | Fukada | |
| 6,998,712 B2 | 2/2006 | Okada et al. | |

(Continued)

FOREIGN PATENT DOCUMENTS

CN       1770432 A       5/2006

(Continued)

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, IEEE, pp. 54-55.

(Continued)

*Primary Examiner*—David A Zarneke
(74) *Attorney, Agent, or Firm*—Slater & Matsil, L.L.P.

(57) ABSTRACT

A novel die saw crack stopper that consists of placing formations into the scribe line of multiple metal layers of a die. These formations comprise multiple right angle shapes that are interconnected at right angles. In an embodiment the formations have an overall shape that has a special meaning, such as a single right angle "z" shape along with a discontinuous cross piece, two interlocking right angle "z" shapes, "t", multiple sets of parallel lines perpendicular to each other, with one set having a line that only intersects a single line from the other set, or the like. The formations in a single layer can be placed such that they are located adjacent to each other along an axis that runs substantially parallel with the scribe line. These formations can also be connected to other formations in other metal layers located either above or below the formation.

17 Claims, 7 Drawing Sheets

U.S. PATENT DOCUMENTS

| | | | |
|---|---|---|---|
| 7,042,099 B2 * | 5/2006 | Kurashima et al. | 257/774 |
| 7,126,225 B2 * | 10/2006 | Su et al. | 257/775 |
| 7,129,566 B2 * | 10/2006 | Uehling et al. | 257/620 |
| 7,135,384 B2 | 11/2006 | Takyu et al. | |
| 7,138,297 B2 | 11/2006 | Iijima et al. | |
| 7,145,211 B2 | 12/2006 | Mallikarjunaswamy et al. | |
| 7,291,874 B2 | 11/2007 | Hsu | |
| 7,456,507 B2 | 11/2008 | Yang | |
| 2001/0008296 A1 | 7/2001 | Gelsomini et al. | |
| 2002/0024115 A1 | 2/2002 | Ibnabdeljalil et al. | |
| 2004/0119164 A1 * | 6/2004 | Kurashima et al. | 257/758 |
| 2005/0026397 A1 | 2/2005 | Daubenspeck et al. | |
| 2005/0098893 A1 * | 5/2005 | Tsutsue et al. | 257/758 |
| 2005/0280120 A1 * | 12/2005 | Tomita | 257/620 |
| 2006/0001144 A1 * | 1/2006 | Uehling et al. | 257/690 |
| 2006/0055002 A1 | 3/2006 | Yao et al. | |
| 2006/0055007 A1 | 3/2006 | Yao et al. | |

FOREIGN PATENT DOCUMENTS

CN      1830079 A      9/2006

OTHER PUBLICATIONS

"Motorola MC7457RX1000NB Microprocessor," Sample Prep Delamination, Motorola Chipworks, Mar. 15, 2005, 1 page, Figure 3.1.3 Die Seal.

* cited by examiner

US 7,646,078 B2

DIE SAW CRACK STOPPER

TECHNICAL FIELD

The present invention relates generally to forming semiconductor structures, and more particularly to preventing cracks when sawing semiconductor dies.

BACKGROUND

In the manufacturing of semiconductor devices, a silicon wafer is first produced. These wafers are created by growing a single silicon crystal. This crystal is then processed through such steps as the evaluation and testing of the physical properties of the crystal, grinding the crystal to a desired diameter, sawing the single silicon crystal into wafers, marking the wafers with a laser, grinding the wafers to a specified thickness, edge rounding, etching away damaged areas, and polishing the surface.

These wafers are then processed into individual dies by the deposition and placement of structures and layers onto the wafers. Once each of the dies has been tested for functionality, the dies are separated from the wafer using a saw. Generally, sufficient space is left between adjacent dies to allow for the width of a saw blade during cutting. This space between the dies is referred to as a scribe line. These scribe lines usually contain test structures used to verify the properties of the die.

Unfortunately, the physical process of sawing the wafer may damage the physical structure of the dies. For example, the saw could crack the silicon crystal of the wafer, and these cracks could then propagate through the dies. The saw may also cause a partial or complete delamination of the dies, essentially pulling off some of the layers that have been deposited onto the wafer. Additionally, the test structures, which could be located in the scribe line itself, can also cause cracking when the die is cut. Damage such as this would render the dies unusable and ruin the commercial value of the dies.

One attempt to contain this cracking and delaminating consists of depositing a seal ring onto the wafers in order to stop the propagation of the die saw cracks. However, this seal ring occasionally fails, in which case there is nothing further to prevent the cracks or delamination from propagating and ruining the commercial use of the die.

Another attempt to contain cracks and delamination is to use dummy metal structures 103 in the scribe line 102, as described in FIG. 1. These dummy metal structures 103 are normally used to balance the metal density during chemical mechanical polishing (CMP). However, when they are used appropriately, they can act as a precipitate in order to stop dislocation movement, and prevent cracks and delamination from spreading. These dummy metal structures 103 could be placed all around the die, or else they could be placed in areas where potential cracking would be concentrated, such as the corners of the die. While these dummy metal structures 103 are typically square in shape, an "L" shape has also been used to prevent cracks from propagating. However, neither of these shapes is necessarily the best shape to use in stopping these cracks and delamination, from either a technical or a meaningful sense. Therefore, a system and method is needed to prevent or reduce the cracks and delamination from propagating beyond the scribe line.

SUMMARY OF THE INVENTION

These and other problems are generally solved or circumvented, and technical advantages are generally achieved, by preferred embodiments of the present invention that allow for meaningful shapes to be placed into the scribe region in an effort to better prevent or reduce the propagation of cracks and delamination.

One aspect of the present invention involves a semiconductor die comprising a substrate, one or more electronic devices on the substrate, and multiple dielectric and metal layers. Within the scribe region of the die, multiple formations are placed in a line substantially parallel to the outer edge of the die. These formations are composed of multiple right-angle shapes that are interconnected at right angles to each other.

Another aspect of the present invention involves a semiconductor die comprising a substrate, one or more electronic devices on the substrate, and multiple dielectric and metal layers. Within the scribe region of the die, multiple crack reducers are placed in a line substantially parallel to the outer edge of the die. These formations are composed of multiple right-angle shapes that are interconnected at right angles to each other, and are placed in a continuous line abutting one or more of the other crack reducers.

Yet another aspect of the present invention involves a semiconductor die comprising a substrate, one or more electronic devices on the substrate, and multiple dielectric and metal layers. Within the scribe region of the die, multiple crack reducers are placed in multiple layers of the die and the crack reducers are placed in a line substantially parallel to the outer edge of the die. These formations are generally multiple right-angle shapes interconnected at right angles to each other. These crack reducers may be connected to another crack reducer located in another layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

Figure 1:
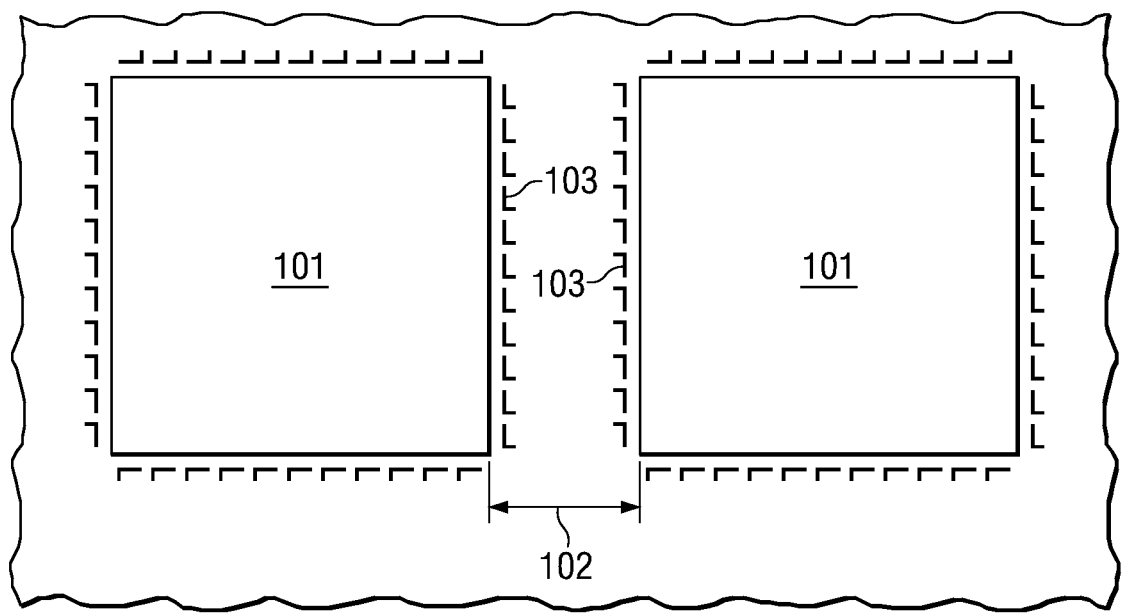
FIG. 1 shows the prior art dummy metal with an "L" shape placed within the scribe line of a die.
Figure 2:
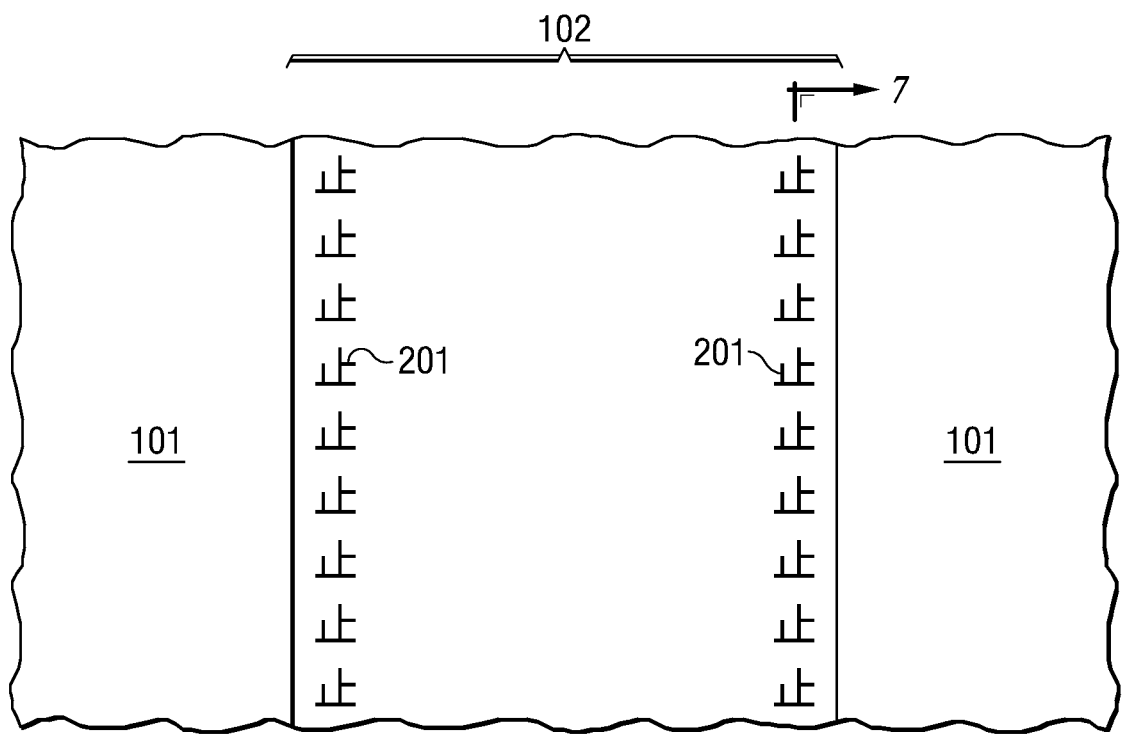
FIG. 2 is a plan view of a portion of a wafer including formations placed in the scribe line of a die in accordance with an embodiment of the present invention.

With reference to FIG. 2, an embodiment of the present invention is shown in which formations 201 are placed in a scribe line 102 of a wafer in order to reduce or prevent cracks and delamination from propagating. As discussed above, a wafer generally comprises a plurality of individual dies 101, wherein each die 101 includes a substrate having electronic devices formed thereon as is known in the art. The substrate is typically covered with one or more dielectric layers and one or more conductive layers between dielectric layers. The conductive layers provide connectivity and routing for the underlying electronic devices.

In an embodiment, the formations 201 are positioned in one or more of the dielectric or conductive layers (an example of this embodiment is discussed below with reference to FIG. 7). For example, in an embodiment the formations 201 are formed in one or more of the conductive layers. As one of ordinary skill in the art will appreciate, in this embodiment the conductive layers and the formations 201 may be formed simultaneously by altering the appropriate masks to form the formations 201. In other embodiments, additional masks may be used if different characteristics, such as the depth or thickness of the formations 201 as compared to the conductive lines, are desired.

The formations 201 are placed into the scribe line 102 to stop cracks from propagating. The formations 201 could be placed all around the die to stop the propagation of cracks. Alternatively, the formations 201 could be placed in specific areas of the die where cracks are concentrated, such as the corners of the die.

In a preferred embodiment, the conductive layers and the formations 201 comprise a metal. The formations 201 are preferably placed into one or more metal layers of the wafer, and can be formed simultaneously with the metal layers by changing masks accordingly. When placed into the metal layers, the formations 201 can also be used as a dummy metal for chemical mechanical polishing (CMP) planarization. The formations 201 preferably have a height and a width of between about 3 µm and about 10 µm in a plane substantially parallel to the major surface of the wafer. The thickness of the formations 201 are preferably between about 1,500 Å to about 20,000 Å, or substantially the same thickness as the metal layer into which they are placed. However, these formations 201 could have a thickness either greater than or less than the metal layer into which they are placed.

Figure 3:
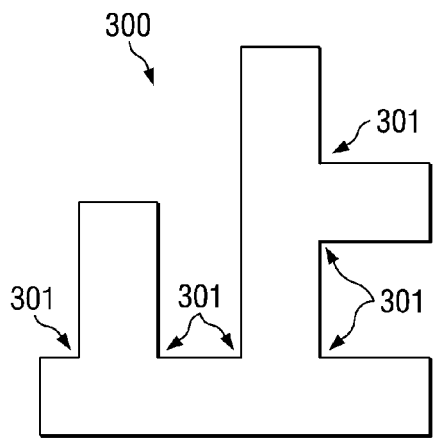
FIG. 3 is an embodiment of a formation in a shape comprising a first linear piece, a second linear piece extending away from the first linear piece, a third linear piece parallel to the second linear piece and extending away from the first linear piece in the same direction as the second linear piece, and a fourth linear piece parallel to the first linear piece and extending away from the third liner piece in accordance with an embodiment of the present invention.

FIG. 3 is an enlarged view of the formations 201 of FIG. 2 that may be used in accordance with an embodiment of the present invention. The shape 300 comprises six right angle shapes 301 that are interconnected at right angles. The overall shape comprises has a first linear piece, a second linear piece extending away from the first linear piece, a third linear piece parallel to the second linear piece and extending away from the first linear piece in the same direction as the second linear piece, and a fourth linear piece parallel to the first linear piece and extending away from the third liner piece. This shape could also be seen as being formed of a first set of parallel lines and a second set of parallel lines running perpendicular to the first set of parallel lines, wherein one of the second set of parallel lines intersects only one of the first set of parallel lines. This shape and word has special meaning and metaphysical power because the formations 201 will be used to "stop" cracks and delamination from propagating, which can be useful when marketing the formations 201. This shape 300 is preferably about 3 um in length and about 3 um in width in a plane substantially parallel to the major surface of the wafer.

Figure 4:
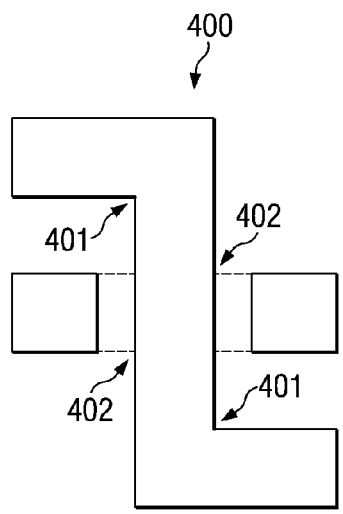
FIG. 4 is an embodiment of a formation in the shape of a single right angle "z" shape along with a discontinuous cross piece in accordance with an embodiment of the present invention.

FIG. 4 shows another shape 400 that may be used as the formations 201 in accordance with another embodiment of the present invention. The shape 400 comprises two right angle shapes 401 that are interconnected at right angles to each other, and two "broken" right angle shapes 402 that are also at right angles to the regular right angle shapes, but "broken" because they do not connect with the regular right angle shapes. The overall shape 400 forms a single right angle "z" shape along with a discontinuous cross piece. This shape 400 also has a special, metaphysical meaning that can be useful when marketing the formations 301. The overall shape 400 in this embodiment is preferably about 3 um in length and 2.4 um in width in a plane substantially parallel to the major surface of the wafer.

Figure 5:
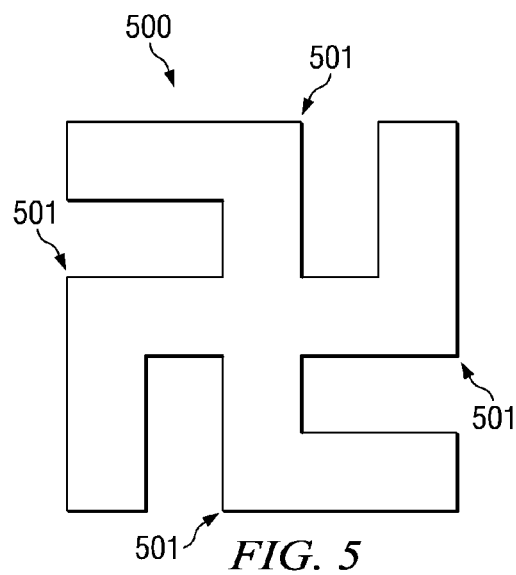
FIG. 5 is an embodiment of a formation in the shape of two interlocking right angle "z" shapes in accordance with an embodiment of the present invention.

FIG. 5 shows yet another shape 501 that may be used as the formations 201 in accordance with yet another embodiment of the present invention. The shape 500, two interlocking right angle "z" shapes, comprises four right angle shapes 501 that are interconnected at right angles to each other, thereby forming four additional right-angle shapes. This shape 500 also has a special, metaphysical meaning that can be useful when marketing the formations 201. The overall shape 500 in this embodiment is preferably about 3 um in width and about 3 um in length in a plane substantially parallel to the major surface of the wafer.

Figure 6:
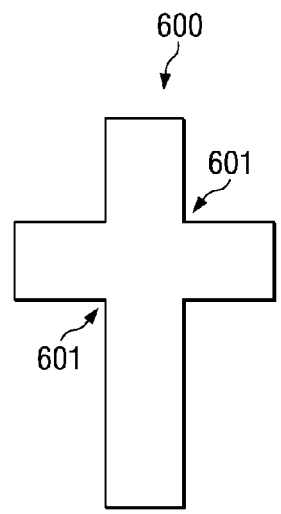
FIG. 6 is an embodiment of a formation in the shape of a "t" symbol in accordance with an embodiment of the present invention.

FIG. 6 shows yet another shape 600 that may be used as the formations 201 in accordance with yet another embodiment of the present invention. The shape 600, a 't', is composed of two right-angle shapes 601 that are interconnected at right angles, thereby forming a total of four right-angle shapes. This shape 600 has a special, metaphysical meaning that can be useful when marketing the formations 201. The overall shape 600 in this embodiment is preferably about 3 um in length and about 1.8 um in width in a plane substantially parallel to the major surface of the wafer.

Figure 7:
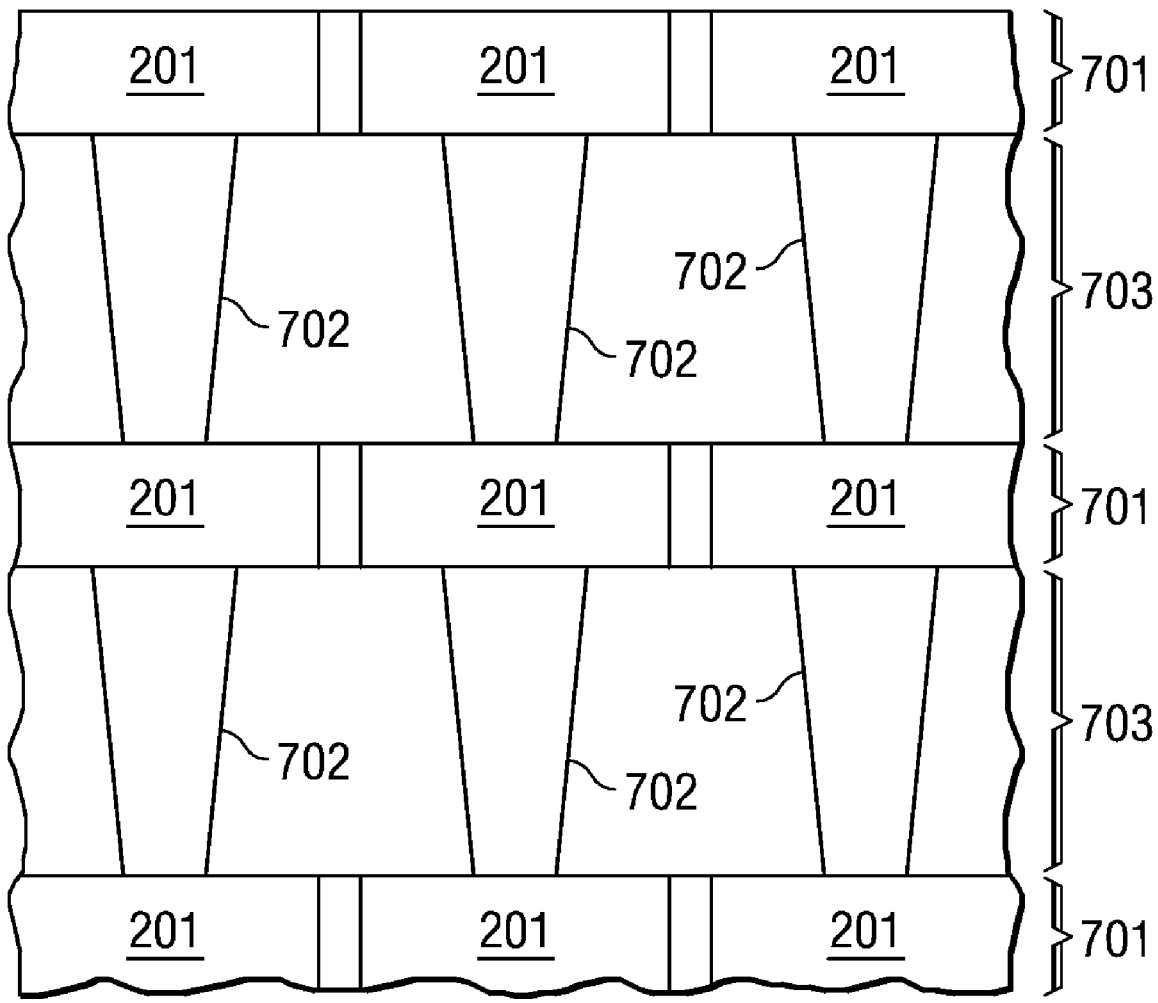
FIG. 7 is a cross sectional view of formations formed on multiple layers, in accordance with an embodiment of the present invention.

FIG. 7 is a cross sectional view taken along the axis indicated in FIG. 2, wherein the formations 201 are embedded in multiple metal layers 701 of the die (but still located within the scribe line). Each of the metal layers 701 is separated from other metal layers by dielectric layers 703. In this embodiment at least one or more optional vias 702 interconnect formations 201 located in separate metal layers 701. These vias 702 can be formed through a damascene process, whereby masks are deposited onto the surface, holes are etched into the surface, and conductive material (such as copper) is used to fill the holes. However, other methods and materials that are known in the art could also be used to form the vias 702.

Figure 8A:
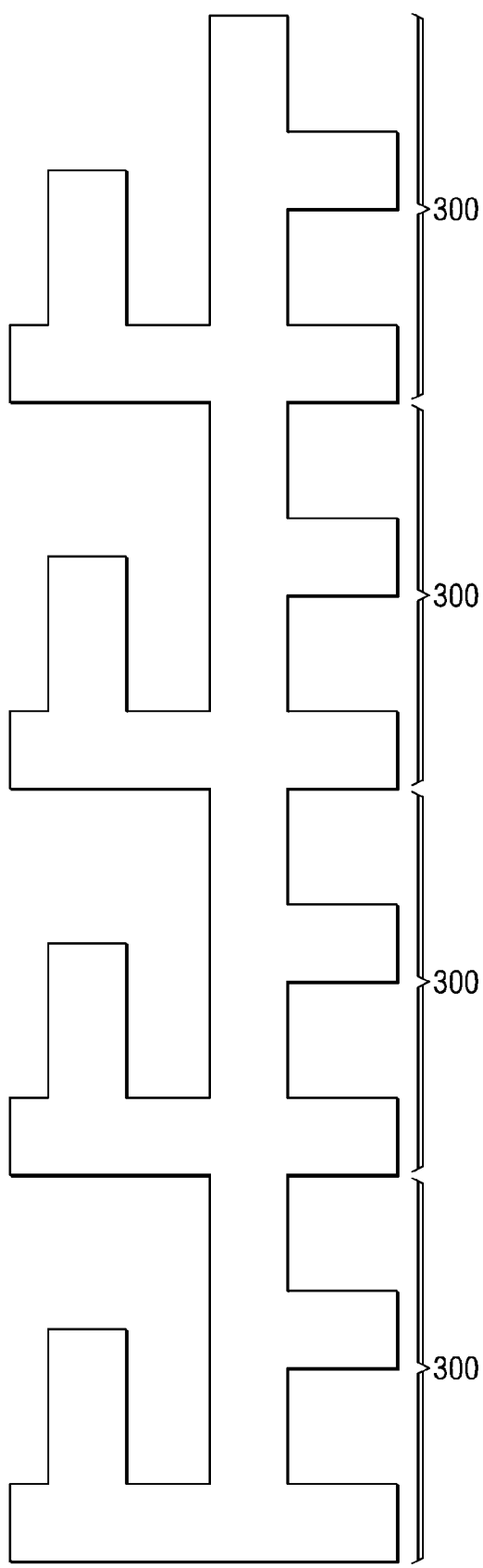
FIGS. 8A-8G show different arrangements of the formations placed into the scribe lines in accordance with an embodiment of the present invention.
Figure 8B:
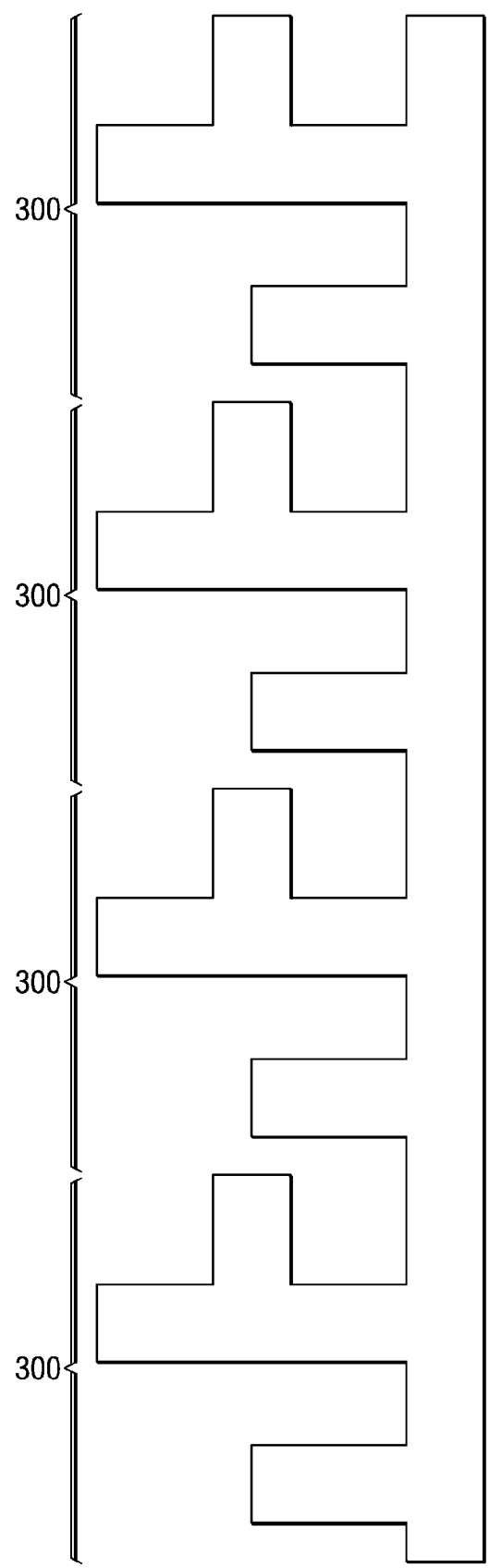
Figure 8C:
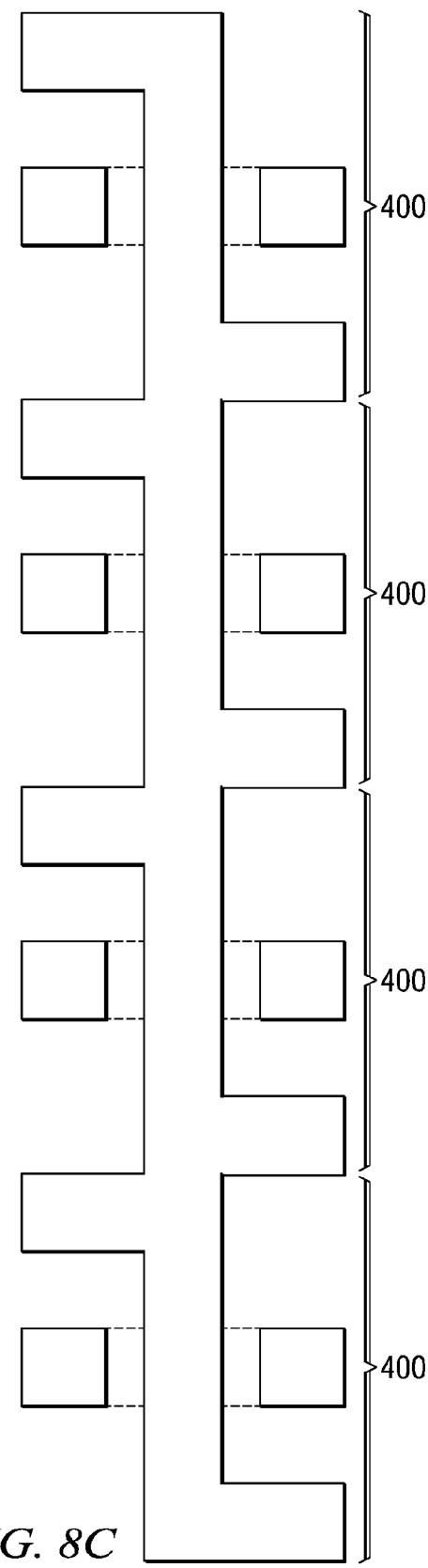
Figure 8D:
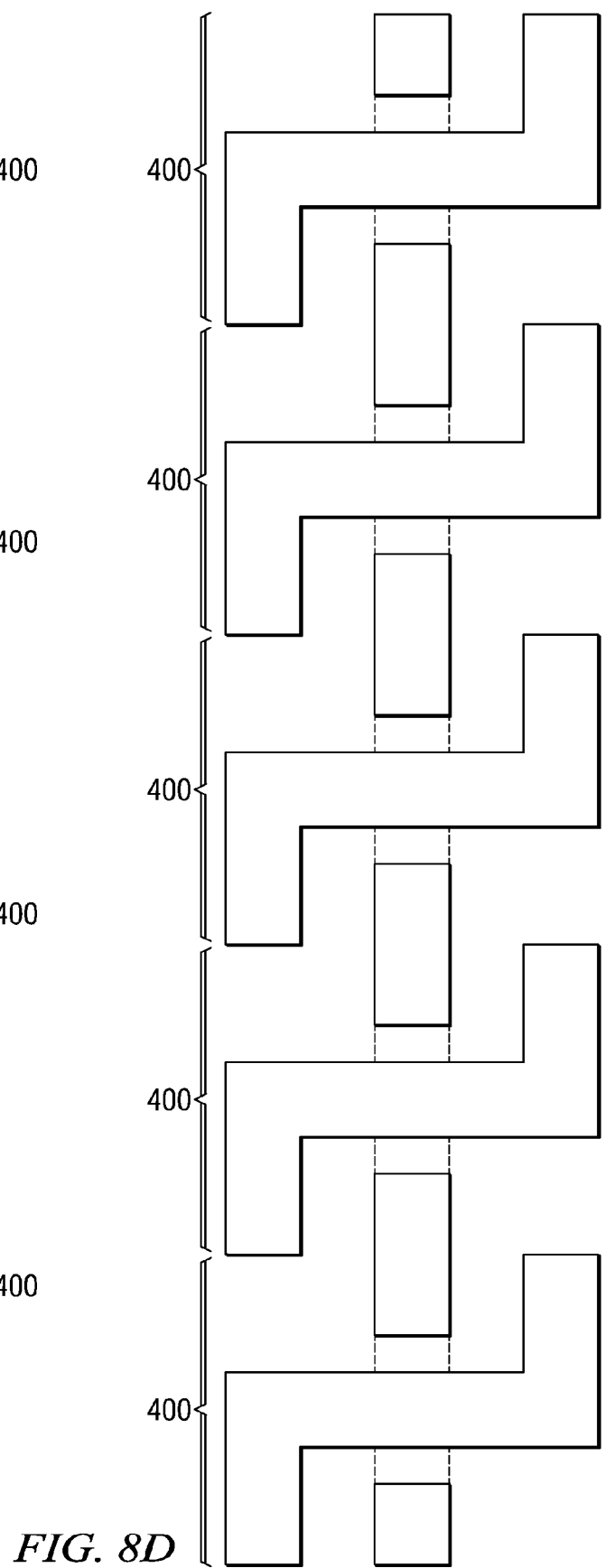
Figure 8E:
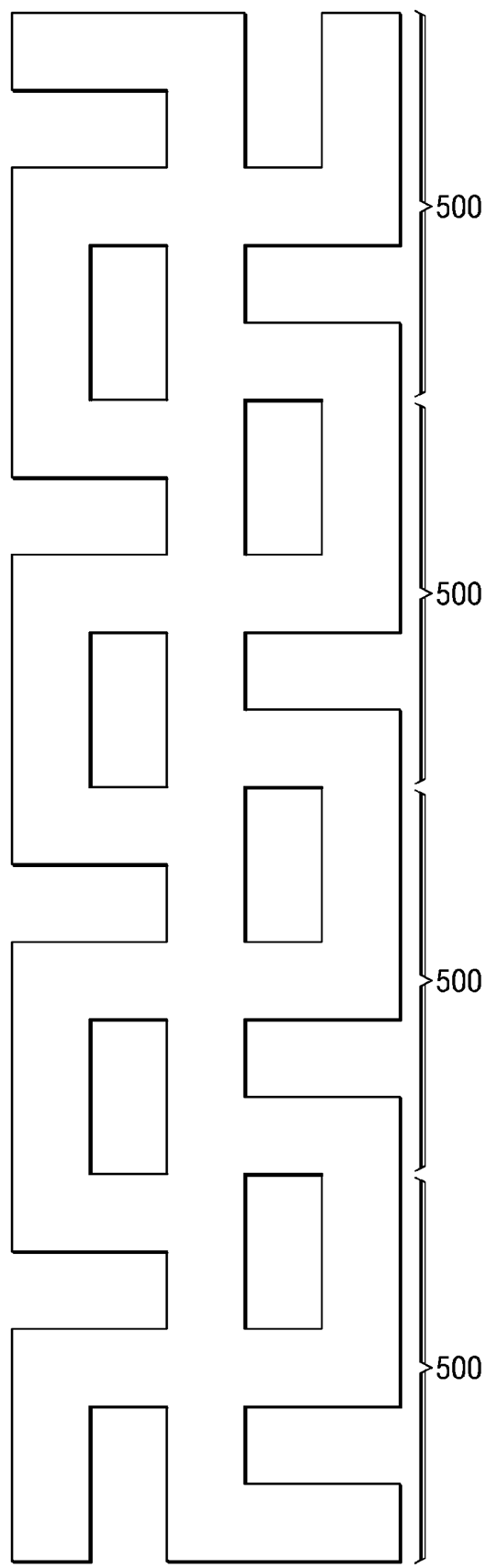
Figure 8F:
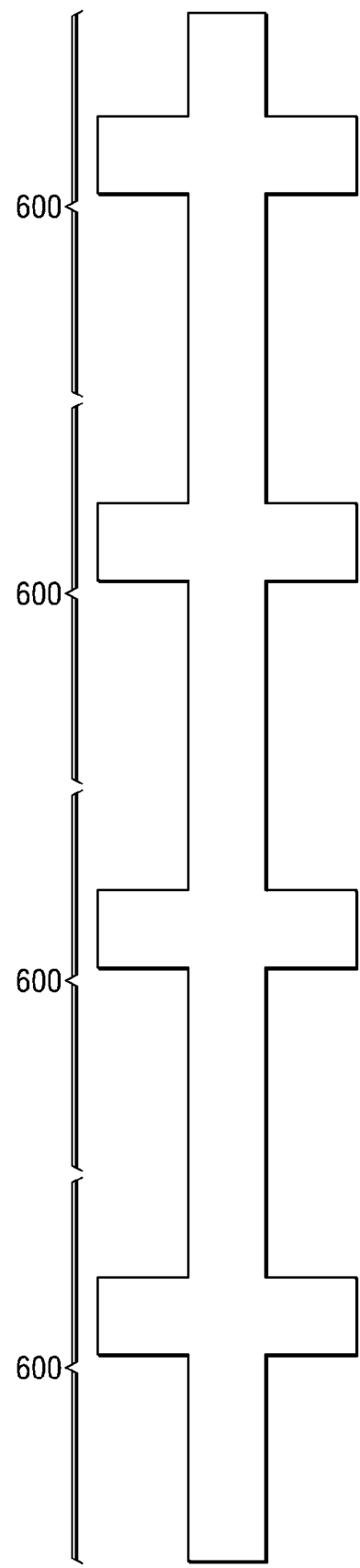
Figure 8G:
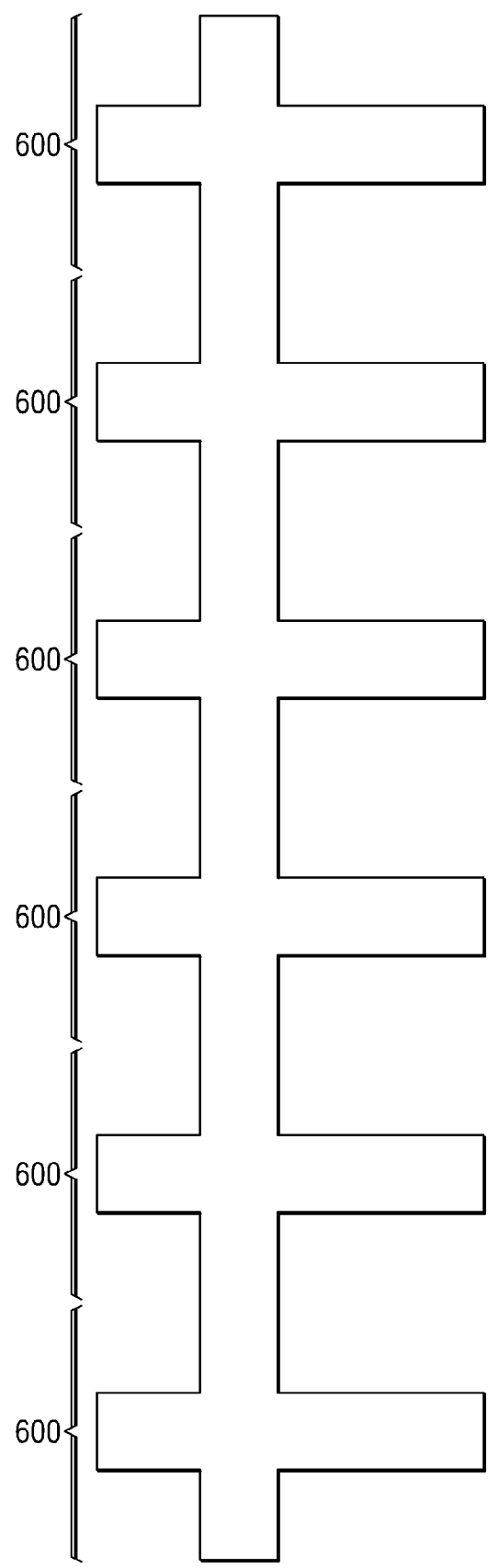

In other embodiments of the present invention, multiple formations 201, such as those illustrated in FIGS. 3-6, are located abutting each other within a single layer 701 to form a line substantially parallel to the longitudinal axis of the scribe line, as illustrated in FIG. 8A-8G. In particular, FIGS. 8A and 8B illustrate two orientations wherein multiple shapes 300 (FIG. 3) are joined to form a solid line. FIGS. 8C and 8D illustrate two orientations wherein multiple shapes 400 (FIG. 4) are joined to form a solid line. FIG. 8E illustrates an orientation wherein multiple shapes 500 (FIG. 5) are joined to form a solid line. FIGS. 8F and 8G are two orientations wherein multiple shapes 600 (FIG. 6) are joined to form a solid line.

Although the present invention and its advantages have been described in detail, it should be understood that various changes, substitutions and alterations can be made herein without departing from the spirit and scope of the invention as defined by the appended claims. For example, there are multiple materials for the creation of the formations 201. Any of these materials that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A semiconductor die having a substantially rectangular shape and a scribe region along the outer circumference of the die, the semiconductor die comprising;
    a substrate;
    one or more electronic devices located on the substrate;
    a plurality of dielectric layers located over the substrate;
    one or more metal layers located over the substrate and interspersed between the dielectric layers; and
    a plurality of formations located within the scribe region of the semiconductor die and positioned along an axis that is substantially parallel to a closest outer edge of the semiconductor die, each formation separated from the other formations and comprised at least in part of a plurality of right angle shapes, at least one of the right angle shapes having a right angle facing away from a center of the formation;
    wherein at least one of the formations is located along only one edge of the semiconductor die.

2. The semiconductor die of claim 1, wherein each formation comprises:
    a first linear piece;
    a second linear piece extending away from the first linear piece;
    a third linear piece parallel to the second linear piece and extending away from
    the first linear piece in the same direction as the second linear piece; and
    a fourth linear piece parallel to the first linear piece and extending away from the third liner piece.

3. The semiconductor die of claim 1, wherein each formation is the shape of a "t".

4. The semiconductor die of claim 1, wherein each formation is the shape of two interlocking right angle "z" shapes.

5. The semiconductor die of claim 1, wherein each formation is the shape of a single right angle "z" shape along with a discontinuous cross piece.

6. A semiconductor die having a substantially rectangular shape and a scribe region along the outer circumference of the die, the semiconductor die comprising;
    a substrate;
    one or more electronic devices located on the substrate;
    one or more dielectric layers located over the substrate;
    one or more metal layers located over the substrate and interspersed between the dielectric layers; and
    a plurality of crack reducers located within the scribe region of the die and positioned along an axis that is substantially parallel to an outer axis of the semiconductor die, the crack reducers being composed of a plurality of right-angle shapes interconnected to form a line substantially parallel to the outer edge of the semiconductor die, wherein at least two of the right-angle shapes intersecting the line are asymmetrical with each other.

7. The semiconductor die of claim 1, wherein each formation comprises:
    a first linear piece;
    a second linear piece extending away from the first linear piece;
    a third linear piece parallel to the second linear piece and extending away from
    the first linear piece in the same direction as the second linear piece; and
    a fourth linear piece parallel to the first linear piece and extending away from the third liner piece.

8. The semiconductor die of claim 1, wherein each formation is the shape of "t".

9. The semiconductor die of claim 1, wherein each formation is the shape of two interlocking right angle "z" shapes.

10. The semiconductor die of claim 1, wherein each formation is the shape of a single right angle "z" shape along with a discontinuous cross piece.

11. A semiconductor die having a substantially rectangular shape and a scribe region along the outer circumference of the die, these die comprising;
    a substrate;
    one or more electronic devices located on the substrate;
    a plurality of dielectric layers located over the substrate;
    one or more metal layers located over the substrate and interspersed between the dielectric layers; and
    a plurality of crack reducers located within a plurality of metal layers and located within the scribe region of the semiconductor die and positioned along an axis that is substantially parallel to a nearest outer edge of the semiconductor die, each crack reducer being asymmetric and composed of a plurality of right-angle shapes, one or more of the crack reducers being connected to one or more crack reducers located in another layer;
    wherein at least one of the plurality of crack reducers is wholly located along a single side of the semiconductor die.

12. The semiconductor die of claim 1, wherein each formation comprises:
    a first linear piece;
    a second linear piece extending away from the first linear piece;
    a third linear piece parallel to the second linear piece and extending away from
    the first linear piece in the same direction as the second linear piece; and
    a fourth linear piece parallel to the first linear piece and extending away from the third liner piece.

13. The semiconductor die of claim 1, wherein each formation is the shape of a "t".

14. The semiconductor die of claim 1, wherein each formation is the shape of two interlocking right angle "z" shapes.

15. The semiconductor die of claim 1, wherein each formation is the shape of a single right angle "z" shape along with a discontinuous cross piece.

16. The semiconductor die of claim 11, wherein the one or more crack reducers are connected by a via.

17. The semiconductor die of claim 11, wherein the crack reducers interconnect to form a line substantially parallel to the outer edge of the semiconductor die.

* * * * *

UNITED STATES PATENT AND TRADEMARK OFFICE
CERTIFICATE OF CORRECTION

PATENT NO. : 7,646,078 B2  Page 1 of 2
APPLICATION NO. : 11/654428
DATED : January 12, 2010
INVENTOR(S) : Jeng et al.

It is certified that error appears in the above-identified patent and that said Letters Patent is hereby corrected as shown below:

In Col. 2, line 50, delete "liner" and insert --linear--.
In Col. 3, line 64, delete "liner" and insert --linear--.
In Col. 4, line 18, delete "301" and insert --201--.
In Col. 5, line 42, Claim 2, after from, delete the paragraph return.
In Col. 5, line 46, Claim 2, delete "liner" and insert --linear--.
In Col. 6, line 5, Claim 7, delete "1" and insert --6--.
In Col. 6, lines 5-6, Claim 7, delete "formation" and insert --crack reducer--.
In Col. 6, line 7, Claim 7, delete "linear piece" and insert --set of parallel lines; and--.
In Col. 6, lines 8-15, Claim 7, delete
"a second linear piece extending away from the first linear piece;
a third linear piece parallel to the second linear piece and extending away from the first linear piece in the same direction as the second linear piece; and
a fourth linear piece parallel to the first linear piece and extending away from the third liner piece."
and insert
--a second set of parallel lines running perpendicular to the first set of parallel lines wherein a first one of the second set of parallel lines intersects each of the first set of parallel lines, and, wherein a second one of the second set of parallel lines intersects only one of the first set of parallel lines.--.
In Col. 6, line 16, Claim 8, delete "1" and insert --6--.
In Col. 6, lines 16-17, Claim 8, delete "formation" and insert --crack reducer--.
In Col. 6, line 18, Claim 9, delete "1" and insert --6--.
In Col. 6, lines 18-19, Claim 9, delete "formation" and insert --crack reducer--.
In Col. 6, line 20, Claim 10, delete "1" and insert --6--.
In Col. 6, lines 20-21, Claim 10, delete "formation" and insert --crack reducer--.
In Col. 6, line 42, Claim 12, delete "1" and insert --11--.
In Col. 6, lines 42-43, Claim 12, delete "formation" and insert --crack reducer--.
In Col. 6, line 48, Claim 12, after from, delete the paragraph return.
In Col. 6, line 52, Claim 12, delete "liner" and insert --linear--.
In Col. 6, line 53, Claim 13, delete "1" and insert --11--.
In Col. 6, lines 53-54, Claim 13, delete "formation" and insert --crack reducer--.

Signed and Sealed this

First Day of June, 2010

David J. Kappos
*Director of the United States Patent and Trademark Office*

CERTIFICATE OF CORRECTION (continued)
U.S. Pat. No. 7,646,078 B2

In Col. 6, line 55, Claim 14, delete "1" and insert --11--.
In Col. 6, lines 55-56, Claim 14, delete "formation" and insert --crack reducer--.
In Col. 6, line 57, Claim 15, delete "1" and insert --11--.
In Col. 6, lines 57-58, Claim 15, delete "formation" and insert --crack reducer--.